(12) United States Patent
Ponce-Pedraza et al.

(10) Patent No.: US 10,373,801 B2
(45) Date of Patent: Aug. 6, 2019

(54) SYSTEMS AND METHODS FOR MEASURING MAGNETIC FIELDS PRODUCED WITHIN MICROSCOPES

(71) Applicants: Arturo Ponce-Pedraza, San Antonio, TX (US); Miguel Jose Yacaman, San Antonio, TX (US); John Eder Sanchez, San Antonio, TX (US)

(72) Inventors: Arturo Ponce-Pedraza, San Antonio, TX (US); Miguel Jose Yacaman, San Antonio, TX (US); John Eder Sanchez, San Antonio, TX (US)

(73) Assignee: Board of Regents, The University of Texas System, Austin, TX (US)

(*) Notice: Subject to any disclaimer, the term of this patent is extended or adjusted under 35 U.S.C. 154(b) by 34 days.

(21) Appl. No.: 15/495,874

(22) Filed: Apr. 24, 2017

(65) Prior Publication Data

US 2017/0309447 A1    Oct. 26, 2017

Related U.S. Application Data

(60) Provisional application No. 62/326,373, filed on Apr. 22, 2016.

(51) Int. Cl.
*H01J 37/26* (2006.01)
*H01J 37/141* (2006.01)
(Continued)

(52) U.S. Cl.
CPC ............ *H01J 37/266* (2013.01); *G01R 33/07* (2013.01); *H01J 37/141* (2013.01); *H01J 37/20* (2013.01); *H01J 2237/262* (2013.01)

(58) Field of Classification Search
CPC ........ H01J 37/266; H01J 37/20; H01J 37/141; G01R 33/07
See application file for complete search history.

(56) References Cited

U.S. PATENT DOCUMENTS

| | | | | |
|---|---|---|---|---|
| 4,170,737 A | * | 10/1979 | Bobrov | H02N 2/101 250/442.11 |
| 4,833,330 A | * | 5/1989 | Swann | H01J 37/02 250/442.11 |

(Continued)

FOREIGN PATENT DOCUMENTS

WO    WO2013078332 A1    5/2013

OTHER PUBLICATIONS

Cantu-Valle, et al. Mapping the magnetic and crystal structure in cobalt nanwires, Journal of Applied Physics 118, 2015 AIP Publishing, LLC.

(Continued)

*Primary Examiner* — Tung X Nguyen
*Assistant Examiner* — Dominic E Hawkins
(74) *Attorney, Agent, or Firm* — Thomas | Horstemeyer, LLP

(57) ABSTRACT

In some embodiments, a system for measuring magnetic fields produced within a microscope comprising an electromagnetic lens includes a sensor support element configured to be mounted to a distal end of an elongated support member that is configured to be inserted into the microscope, and a magnetic field sensor supported by the sensor support element, the magnetic field sensor being configured to sense magnetic fields at a position within the electron microscope at which specimens are imaged during operation of the microscope.

10 Claims, 4 Drawing Sheets

(51) Int. Cl.
*G01R 33/07* (2006.01)
*H01J 37/20* (2006.01)

(56) References Cited

U.S. PATENT DOCUMENTS

| | | | | |
|---|---|---|---|---|
| 5,698,856 | A * | 12/1997 | Frasca | H01J 37/20 250/440.11 |
| 6,448,555 | B1 * | 9/2002 | Hosokawa | H01J 37/256 250/311 |
| 9,312,097 | B2 * | 4/2016 | Nackashi | H01J 37/20 |
| 2002/0033695 | A1 * | 3/2002 | Xiao | G01R 33/0385 324/244 |
| 2002/0185599 | A1 * | 12/2002 | Kimura | H01J 37/244 250/310 |
| 2003/0000282 | A1 * | 1/2003 | Ahn | G01N 3/56 73/9 |
| 2004/0003666 | A1 * | 1/2004 | Fischione | H01J 37/20 73/856 |
| 2004/0207396 | A1 * | 10/2004 | Xiao | G01Q 10/04 324/244 |
| 2005/0230636 | A1 * | 10/2005 | Tanaka | H01J 37/20 250/440.11 |
| 2009/0079425 | A1 * | 3/2009 | Huang | G01R 33/07 324/252 |
| 2010/0208054 | A1 * | 8/2010 | Farr | A61B 1/00103 348/80 |
| 2013/0175447 | A1 * | 7/2013 | Sohda | H01J 37/153 250/310 |
| 2014/0087483 | A1 * | 3/2014 | Ohsawa | H01J 37/08 438/3 |
| 2014/0353499 | A1 * | 12/2014 | Terada | H01J 37/26 250/307 |
| 2015/0311029 | A1 * | 10/2015 | Yamazaki | H01J 37/141 250/311 |

OTHER PUBLICATIONS

1. V. V. Volkov, D. C. Crew, Y. Zhu, and L. H. Lewis, Magnetic field calibration of a transmission electron microscope using a permanent magnet material, Review of scientific instruments 73 (2002), 2298-2304.

Kasama, et al., Electron holography of magnetic materials, Technical University of Denmark, published in Holography-Different Fields of Application, 2011.

* cited by examiner

SYSTEMS AND METHODS FOR MEASURING MAGNETIC FIELDS PRODUCED WITHIN MICROSCOPES

CROSS-REFERENCE TO RELATED APPLICATION

This application claims priority to U.S. Provisional Application Ser. No. 62/326,373, filed Apr. 22, 2016, which is hereby incorporated by reference herein in its entirety.

BACKGROUND

Transmission electron microscopy (TEM) is an effective and versatile tool for the structural and chemical characterization of condensed matter at the nanoscale. TEM is applicable for an ample choice of studies, from resolution at the atomic level (known as ultra-high resolution-TEM) to the identification of atomic species and their valence states (known as electron energy loss spectroscopy), or the possibility for carrying out in-situ experiments within a controlled environment within sophisticated holders. Furthermore, the technique provides detailed information on the structure of materials during transformation and its correlation with their magneto-electrical properties. In situ TEM techniques comprise a broad spectrum of topics ranging from liquid and gas environmental TEM, three and four dimensional TEM, nanomechanics, switching of ferroelectrics domains and atomic imaging of light elements. With the advent of recent progress in instrumentation, such as aberration-corrected optics, sample environmental control, and significantly improved data acquisition techniques, the potential for TEM studies has been pushed further with enhanced resolution and the possibility for characterizing physical-chemical properties on an atomic-basis level. In this context, the conventional capabilities of TEM operational modes (diffraction contrast, phase contrast, and electron diffraction) have been expanded by cutting-edge techniques such as electron holography and precession-assisted diffraction.

The knowledge of the electromagnetic properties of materials at the nanoscale level has been made possible through analytical TEM techniques such as electron holography. This powerful technology uses the interference effect of the electron wave to detect and quantify the electromagnetic field of condensed matter at the nanometer scale and enables accurate characterizations of nanosized materials interacting with magnetic and electric fields. In particular, the resolution of the magnetic flux within nanoscale materials is a promising method to gain further physical insight into the magnetic domain formation and magnetization processes of nanoscale magnetic materials, such as magnetic nanowires, rendered as potential alternatives for significant enhancement of magnetic recording media technologies. This enables not only the physical characterization of the magnetic lenses of an electron microscope but also the in-situ analysis of the nanomaterial under study. In this context, a central issue for in-situ TEM studies in the magnetization response of nanomaterials by electron holography is the controlled application of a magnetizing field by using the objective lens (an electromagnetic lens) of the electron microscope as a magnetic field source. In such applications, the proper calibration of the magnetic field for the set of magnetic lenses within the electron microscope is critical in order to establish the effect of such magnetizing flux on the inner magnetization of the material, its magnetic domain configuration, and its magnetization dynamics.

When calibration of the magnetic field generated in the objective lens of an electron microscope is required, specific configurations and designs should be accomplished. For instance, the magnetic lenses in an electron microscope are manufactured using magnetic coils and their power depends on their capacity to increase applied voltage that is associated with the magnification of the electron microscope. There is a direct relationship between the voltage applied and the magnetic field produced, with the higher the voltage, the stronger the magnetic field that is produced. Few works have been reported in the literature for the calibration of the magnetic field within electron microscopes. Although calibration methods have been proposed, some can only be performed after disassembling the electron microscope. Disassembly is time consuming and must be performed very carefully to avoid damaging the critical components of the microscope. Needed is a system and method for in-situ measurement of the magnetic fields while the microscope is still in its fully assembled form.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, it would be desirable to have a system and method for in-situ measurement of the magnetic fields of an electron microscope that does not require disassembly of the microscope. Examples of such systems and methods are disclosed herein. In some embodiments, a system for measuring the magnetic field produced within an electron microscope comprises a magnetic field sensor, such as a Hall effect sensor, that is positioned within the high vacuum column of a transmission electron microscope (TEM) at a position at which a specimen to be imaged is normally positioned. In some embodiments, the sensor is supported within a custom-made circuit board positioned at the end of a specimen holder inserted into the microscope with which measurements made by the sensor can be transmitted to an external magnetometer.

In the following disclosure, various specific embodiments are described. It is to be understood that those embodiments are example implementations of the disclosed inventions and that alternative embodiments are possible. All such embodiments are intended to fall within the scope of this disclosure.

Disclosed herein are magneto-electronic devices configured to characterize the magnetic fields produced by the electromagnetic lenses within microscopes, such as transmission electron microscopes. The quantification of the magnetic field produced by coils in the objective lens of an electron microscope is critical for the analysis of magnetic materials at the nanoscale level as the magnetic field can alter the physical properties of the material and it is important to know if and when this alteration is occurring. In addition, knowledge of the magnetic field that can be applied by the objective lens can be useful in cases in which it is desired to apply a particular magnetic field on the material in order to observe the behavior of the material when a magnetic field is applied.

The magnetic field produced by the objective lens of an electron microscope results from an excitation voltage applied to the coils of the lens. This field can be directly measured within the microscope during its operation (i.e., during excitation of the objective lens) with a magnetic field sensor as the excitation voltage or current of the coils. The magnetic field measured with the magnetic field sensor is, therefore, directly related with the excitation voltage of the lens.

Figure 1:
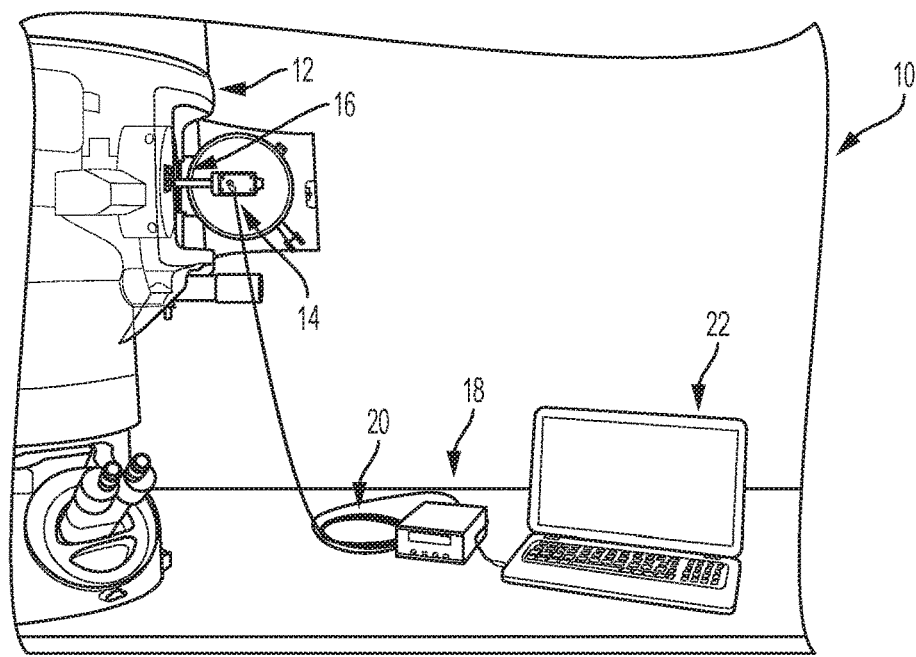
FIG. 1 is a drawing of an embodiment of a system for measuring the magnetic field produced within an electron microscope.

FIG. 1 shows an embodiment of a system 10 for measuring the magnetic field produced within a microscope that comprises one or more electromagnetic lenses. In this example, the system 10 comprises a transmission electron microscope 12, a specimen holder 14 that can be inserted into a specimen port 16 (see FIG. 5) of the electron microscope, a magnetometer 18, such as a Gauss meter, that is configured to measure the strength of magnetic fields and electrically coupled to the specimen holder 14 with a cable 20, and a computing device 22 to which the magnetometer is electrically coupled.

Figure 2:
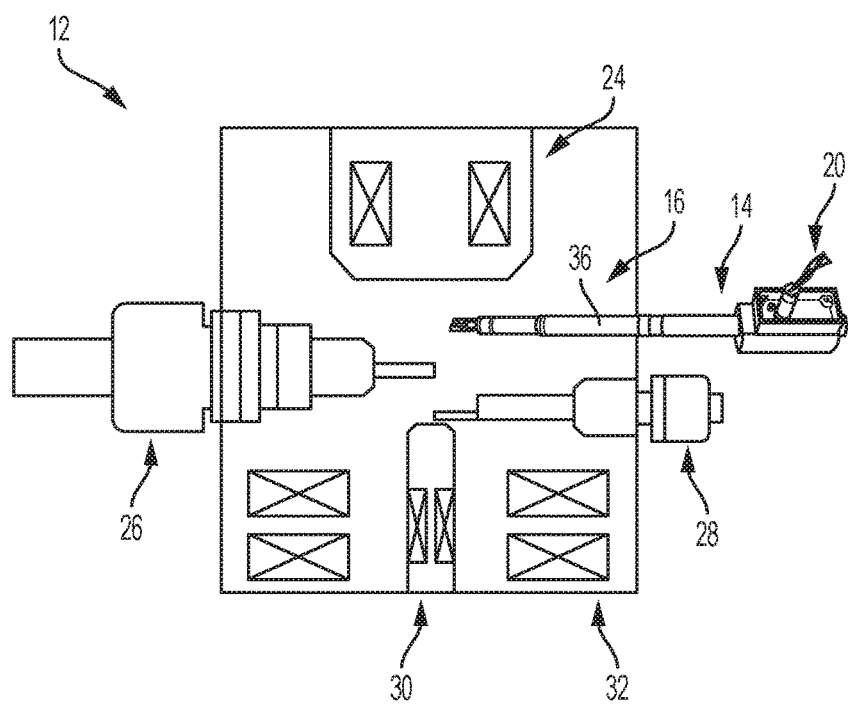
FIG. 2 is a schematic diagram of an embodiment of a transmission electron microscope shown in FIG. 1.

FIG. 2 is a schematic diagram for the electron microscope 12. As indicated in this figure, the microscope 12 includes a condenser minilens 24, objective apertures 26 and 28, an objective minilens 30, and an objective lens 32, which generates a strong magnetic field during operation. It is this magnetic field that can be mapped using the system 10. In some cases, the objective minilens 30 can generate an additional magnetic field at the position of the specimen area. In such cases, it may be important to map its influence on the magnetic field generated for the objective lens 32. The condenser minilens 24 and objective apertures 26, 28 enable the alignment of an electron beam generated within the microscope 12.

As is also shown in FIG. 2, the specimen holder 14 positioned within the specimen port 16 (FIG. 5) comprises a pole piece 36 that extends into the electron microscope 12 such that a magnetic field sensor 38, such as a Hall effect sensor, provided at a distal end of the pole piece is positioned within the high vacuum column of the microscope at a point at which a specimen to be imaged would normally be positioned.

Figure 3:
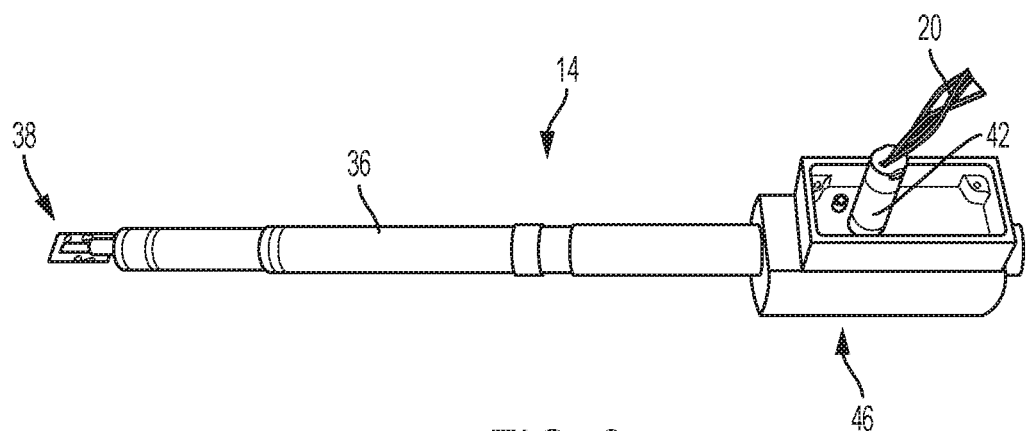
FIG. 3 is a side view of an embodiment of a specimen holder of the system of FIG. 1.
Figure 4:
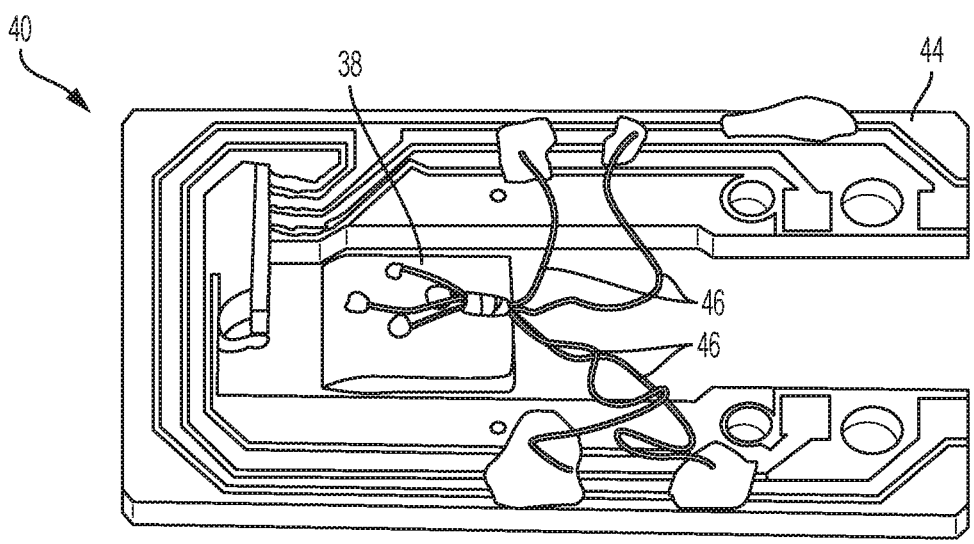
FIG. 4 is top perspective view of an embodiment of a magnetic field sensor and sensor support provided at a distal end of the specimen holder of FIG. 3.

FIG. 3 illustrates the specimen holder 14 separate from the remainder of the system 10. As shown in this figure, the pole piece 36 is an elongated cylindrical member that, for example, is made of a metal material. Provided at the distal end of the pole piece 34 is the magnetic field sensor 38 that, as shown best in the detail drawing of FIG. 4, is supported within a sensor support element 40 that is mounted to the pole piece. The cable 20 is connected to a proximal end of the specimen holder 14 with an electrical connector 42. More particularly, the electrical connector 42 connects with an electrical connector, such as serial port, provided within an end member 46 from which the pole piece 36 extends. Through this connection, the connector 42 is placed in electrical communication with the magnetic field sensor 38 via wires (not visible in FIG. 3) that extend through the pole piece 36 from its proximal end to its distal end. FIG. 4 shows the support element 40 that supports the magnetic field sensor 38 in greater detail. In the embodiment of FIG. 4, the support element 40 comprises a circuit board 44 including various conductor traces to which the magnetic field sensor 38 is electrically connected with small wires 46. Through this connection, voltages output from the magnetic field sensor 38 can be delivered to the magnetometer 18.

Figure 5:
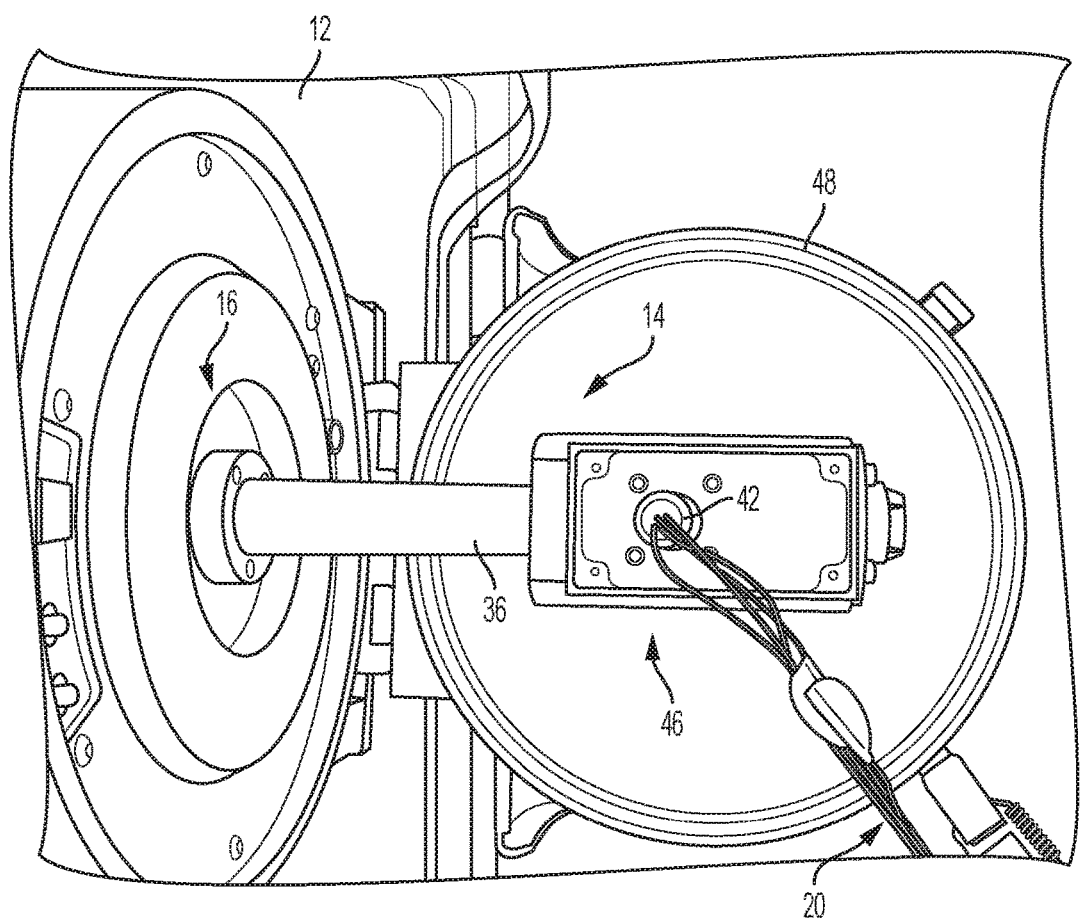
FIG. 5 is detail view showing the specimen holder of FIG. 3 inserted into the electron microscope shown in FIG. 1.

FIG. 5 is a detail view that shows the specimen holder 14 as inserted into the specimen port 16 of the transmission electron microscope 12. As indicated in this figure, the proximal end of the specimen holder 14 is external to the electron microscope 12 when the specimen holder has been fully inserted into the microscope. Once in this position, however, a hinged door 48 can be closed over the proximal end of the specimen holder 14 to form an airtight seal that enables a vacuum to be formed within the microscope 12. The electrical connector 42 is coupled to the specimen holder 14 so that the voltages collected from the magnetic field sensor 38 can be transmitted to the magnetometer 18 via the cable 20, which can pass between the door 48 and the body of the microscope 12 without breaking the seal created with the door. In some embodiments, the electrical connector 40 connects to a serial port, such as an RS232 serial port, provided within the end member 46 positioned at the proximal end of the specimen holder.

It is noted that while a "specimen holder" has been identified above, substantially any other elongated support member that can pass through the specimen port 16 and support the magnetic field sensor 38 in the correct position within the electron microscope 12 can be used.

Tests were performed using a system similar to that described above in relation to FIGS. 1-5. The electron microscopes with which the system was tested were JEOL instruments models ARM200F and JEOL 2010F, both of which are capable of ultra-high resolution (HRTEM) around 1 million times of magnifications in the images of the studied specimens. These instruments are configured with objective lenses called high-resolution pole pieces, which are characteristic of any electron microscope not only for JEOL microscopes but other brands such as FEI, Hitachi, Zeiss, and others. Notably, the inventive system can be used for those instruments having high-resolution pole pieces and also for conventional transmission electron microscopes (CTEM) having lower resolutions (in the range of hundred thousand times of magnifications). Both of them, HRTEM and CTEM, differ one to each other basically by the gap of the pole piece; a short gap leads to higher resolution while a large gap leads to lower resolution. The system was also tested with an electron microscope having double lenses (JEOL ARM200F) in which the second lens (called a minilens) can be used to produce an image at lower resolution. The minilens does not contribute a significant magnetic field at the specimen position, however, it is used to form the image. When an electron microscope operates with only the minilens, this is referred to as Lorentz microscopy mode and is typically used for magnetic specimens that need to be studied under their magnetic state. The inventive system was also tested using Lorentz microscopy and it provided information about a negligible field in the specimen position.

Figure 6:
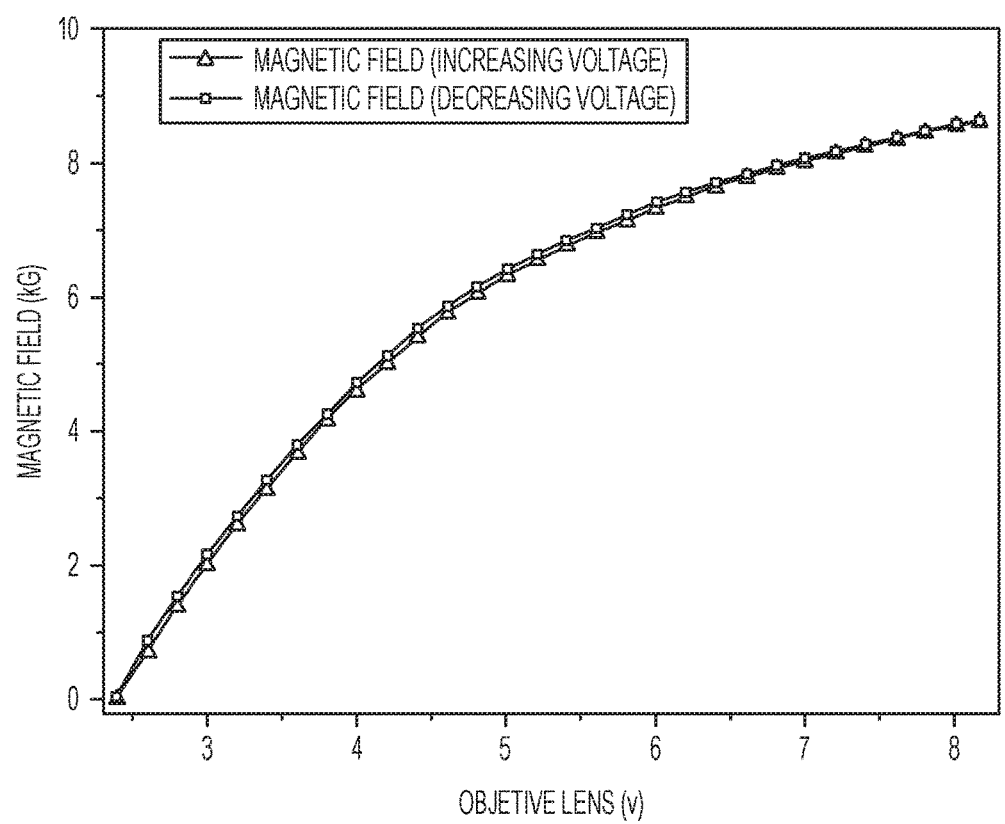
FIG. 6 is a graph that plots a measured magnetic field versus objective lens voltage.

With the system described above, the magnetic fields (e.g., coplanar, paraxial, and axial magnetic fields) produced within the electron microscope can be measured during normal operation of the microscope. In addition, the magnetic fields can be associated with the voltage applied to the objective lens of the electron microscope to reveal the relationship of this voltage and the magnetic field. FIG. 6 is a graph that plots the magnetic field measured by the magnetic field sensor as a function of voltage applied to the coils in the objective lens during experiments performed on a transmission electron microscope. In the illustrated example, the plot was created using LabVIEW software with a high rate of data acquisition and tracking of the magnetic field.

It is noted that the inventive system can also be used to characterize magnetic specimens under excited states with known values of the magnetic field produced by the objective lens. As a practical example, the inventive system was tested by performing magnetic measurements in cobalt and cobalt-nickel alloy nanowires. By effectively turning or switching the magnetic field from the early characterization, which the magnetic field has been quantified by using off-axis electron holography, the in situ magnetization of the electron microscope can be correlated with the magnetic field quantified by holography. In short, the inventive system is flexible and dedicated in sensing the magnetic fields for high-resolution electron microscopes at the specimen position, a feature unique and useful to track the magneto properties of nanomaterials in in situ electron microscope applications. As is apparent from the above discussion, the measurements are made without disassembling the electron microscope As is clear from the foregoing disclosure, the inventive systems and methods enable measurements of coplanar/paraxial-axial magnetic fields inside an electron microscope with very high accuracy (within the range of miligauss). This system/method can be used as a valuable tool for research in the areas of in situ analytical electron microscopy and characterization of nanomaterials. The system/method provide a detail highlight in describing the innovative design for the detection of the magnetic field inside the column of a transmission electron microscope. This system/method provides an electrical output that generates a plot of magnetic field intensity versus objective lens voltage. In short, the system/method is highly flexible and enables sensing of the magnetic fields for high-resolution electron microscopes at the pole piece position, a feature unique and useful to track the magneto properties of nanomaterials in in situ electron microscope applications.

The invention claimed is:

1. A system for measuring the magnetic field produced by an electromagnetic lens within a microscope, the system comprising:
   a magnetic field sensor configured to sense magnetic fields generated by the electromagnetic lens of the microscope;
   a sensor support element that supports the magnetic field sensor;
   an elongated support member to which the sensor support element is mounted, the support member being configured to be inserted into a specimen port of the microscope and position the magnetic field sensor at a position within the microscope at which specimens are imaged; and
   a magnetometer that is in electrical communication with the magnetic field sensor.

2. The system of claim 1, wherein the magnetic field sensor comprises a Hall effect sensor.

3. The system of claim 1, wherein the sensor support element comprises a circuit board to which the magnetic field sensor is electrically connected.

4. The system of claim 1, wherein the elongated support member is a specimen holder comprising a pole piece that is configured to pass through the specimen port and wherein the sensor support element is mounted to a distal end of the pole piece.

5. The system of claim 4, wherein the specimen holder further comprises an end member comprising an electrical connector that is in electrical communication with the magnetic field sensor.

6. The system of claim 1, further comprising a computing device to which the magnetometer is connected, the computing device executing software configured to plot magnetic fields sensed by the magnetic field sensor versus voltages applied to the electromagnetic lens of the microscope.

7. A method for measuring the magnetic field produced by an electromagnetic lens within a microscope, the method comprising:
   mounting a magnetic field sensor to the distal end of an elongated support member;
   inserting the elongated support member into a specimen port of the microscope such that the magnetic field sensor is positioned within a high vacuum column of the microscope at a position at which a specimen can be positioned for imaging;
   exciting the electromagnetic lens of the microscope; and
   measuring magnetic fields within the electron microscope generated by excitation of the electromagnetic lens using the magnetic field sensor.

8. The method of claim 7, wherein the elongated support member comprises a specimen holder and wherein mounting comprises mounting the magnetic field sensor to a distal end of a pole piece of the specimen holder.

9. The method of claim 7, wherein measuring magnetic fields comprises transmitting signals sensed by the magnetic field sensor to a magnetometer using a cable that extends between the elongated support member and the magnetometer.

10. The method of claim 7, further comprising adjusting a voltage applied to the electromagnetic lens of the microscope and measuring the magnetic fields as they change with changes in the voltage so as to correlate the voltage applied to the electromagnetic lens with the magnetic fields applied to a specimen within the microscope.

* * * * *